(12) United States Patent
Rubin

(10) Patent No.: US 6,630,369 B2
(45) Date of Patent: Oct. 7, 2003

(54) SAMPLE PREPARATION APPARATUS AND METHOD

(75) Inventor: Joseph I. Rubin, Monterey Park, CA (US)

(73) Assignee: Ultra Tec Manufacturing, Inc., Santa Ana, CA (US)

( * ) Notice: Subject to any disclaimer, the term of this patent is extended or adjusted under 35 U.S.C. 154(b) by 0 days.

(21) Appl. No.: 09/907,354

(22) Filed: Jul. 17, 2001

(65) Prior Publication Data

US 2003/0017649 A1 Jan. 23, 2003

(51) Int. Cl.[7] .......................... H01L 21/44; H01L 21/48; H01L 21/50
(52) U.S. Cl. .......................... 438/116; 438/14; 438/15; 438/17
(58) Field of Search .......................... 438/116, 14, 15, 438/16, 17, 18; 83/875; 228/112.1

(56) References Cited

U.S. PATENT DOCUMENTS

| | | | |
|---|---|---|---|
| 5,155,068 A | | 10/1992 | Tada |
| 5,242,862 A | | 9/1993 | Okabe et al. |
| 5,355,755 A | * | 10/1994 | Sakata et al. |
| 5,424,254 A | * | 6/1995 | Damiot |
| 5,698,474 A | | 12/1997 | Hurley |

* cited by examiner

Primary Examiner—Olik Chaudhuri
Assistant Examiner—Khiem Nguyen
(74) Attorney, Agent, or Firm—Fulwider Patton Lee & Utech L.L.P.

(57) ABSTRACT

A apparatus and method for forming windows in semiconductor devices to enable visualization of the circuitry therein while electrically intact. The device is affixed to a table that is oscillated in the X and Y directions while a succession of rotating tools are brought to bear against the surface of the device in the Z direction under a constant force. The force is adjustable so as to allow the tool to float on the surface of the workpiece.

13 Claims, 3 Drawing Sheets

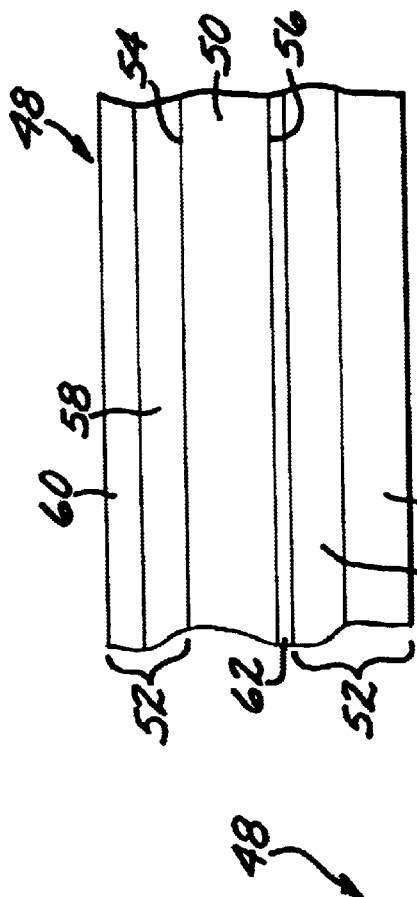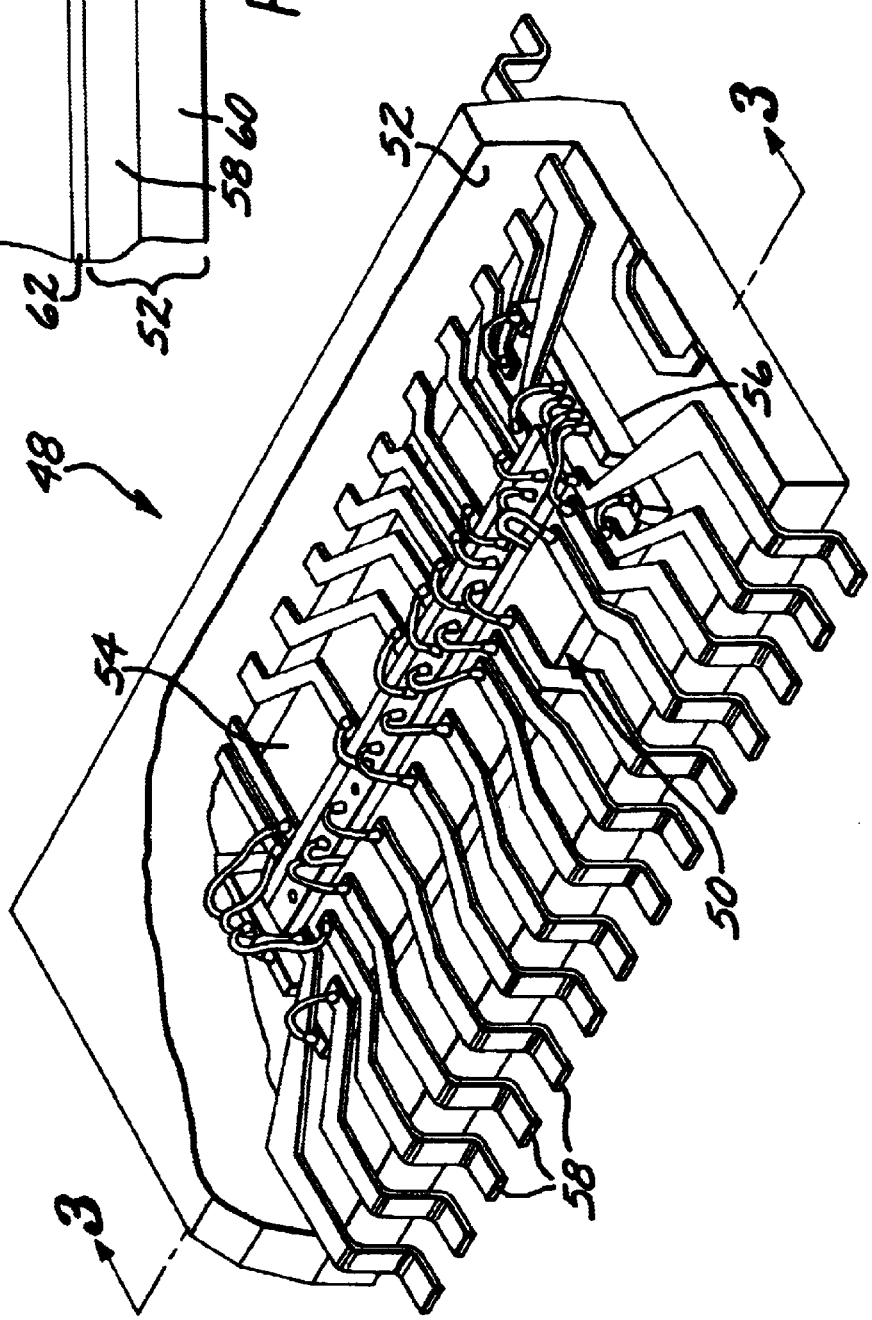

SAMPLE PREPARATION APPARATUS AND METHOD

BACKGROUND OF THE INVENTION

The present invention is directed to an apparatus and method for preparing semiconductor devices for analysis and more specifically pertains to the creation of transparent inspection windows in chips to permit examination of their circuitry while fully functional.

Semiconductor devices are typically encapsulated in resin or ceramic which serves to protect the device and to positively fix in position the conductor leads that extend therefrom. The resin or ceramic capsule serves as a hermetically sealed barrier that has high mechanical strength and is substantially impervious to most chemicals. In order to conduct construction analysis and failure analysis it is absolutely essential for such encapsulation, or at least a portion of such encapsulation, to be removed. Moreover, it is necessary for the integrity and full functionality of the chip to be maintained despite such decapsulation.

Various techniques have been developed for use in evaluating the structure and functions of a semiconductor chip. For example, an image emission microscope may be employed to localize defects in integrated circuits. The utility of the emission microscope is based on the principle of recombinant radiation. In excess current drawing conditions such as occur during semiconductor failure modes, electrons and holes in silicon, recombine and relax, giving off a photon of light which is readily detectable by specialized intensified CCD sensors. Such emissions are non-isotropic and therefore radiate toward the front as well as the back of the die. The predominant value of the technique is rapid detection and failure localization to the junction level of a single transistor in integrated circuits which may include up to 4,000,000 or more transistors. Infrared and thermal techniques have also been developed for the purpose of inspecting chips and identifying failures. Common to all such visualization techniques is the fact that the silicon in the chip acts as a filter for such radiation, and must therefore be thinned in order for a sufficient degree of transparency to be achieved. Gaining access to the silicon die for the purpose of thinning further requires that the plastic encapsulation be removed.

Various decapsulation (or depacking) techniques have been developed in order to gain access to the underlying chip along with techniques with which the thickness of the silicon die can then be reduced. Heretofore used approaches are however all subject to various shortcomings. Planar lapping with diamond slurries allows the requisite thinning to be achieved but because the entire device is lapped, the leads must be bent out of the way and once the lead frame becomes thinned, the leads cannot be bent back to their original configuration without breakage. This in turn precludes socket testing which poses a considerable hardship especially when high lead count devices are involved. Additionally, because the entire wafer must be thinned to the desired depth, the structural integrity of the device becomes severely compromised which renders the subsequent handling and testing of the device difficult. Reagent thinning is possible, but only hydrofluoric acid is capable of effectively dissolving the silicon and hydrofluoric acid is extremely hazardous. Dimpling techniques have also been employed wherein a slow speed grinding wheel extending from a weighted head is spun against the workpiece which is also being slowly spun. This results in a bowl shaped cut known as a dimple having a flat area surrounded by a radiused edge. The inspection area is therefore limited as the regions outside the flatspot abruptly lose contrast due to increasing silicon thickness. Radiused edges cannot be avoided using this technique and larger flat spots can only be achieved by boring successively larger "test holes." The technique is extremely time consuming and can take hours to cut through the packaging material and silicon. Ion milling techniques employing a focused ion beam have also been used with some success but are very slow and only capable of milling out a very tightly defined small area which requires detailed knowledge of the failure site. Such equipment is extremely expensive and requires the work to be performed under a high vacuum. Conventional milling techniques are effective for removing the packaging material but attempts to thin the die typically leads to chipping, gouging and cracking. Even at lower speeds, with the die supported by molding compound, the die tends to shatter. Modification of conventional milling techniques to substantially increase torque and rotational speeds (40,000 to 60,000 rpm) has been found effective to address the problem of breakage but the heat generated by such approach is substantial and requires the use of complex and bulky cooling equipment to prevent damage. Additionally, the extremely high precision with which the position of the cutting tool must be controlled requires the reliance on expensive CNC capability.

An improved approach is therefore needed with which access to the circuitry in packaged microchips can be gained relatively quickly and easily using relatively simple and inexpensive machinery.

SUMMARY OF THE INVENTION

The apparatus and method of the present invention provides an improved approach for thinning selected portions of semiconductor devices so as to render them transparent to infra-red light and thereby enable failure analysis to be carried out using emission microscopy (photon and thermal) as well as infra-red microscopy. The present invention provides for the thinning of an isolated portion or of portions of the backside of packaged devices so as to preserve wiring external to the die intact. The apparatus and method can also effectively be used to gain access to the front side of certain devices including circuit delayering. The thinning may be accomplished in packaged semiconductor devices as well as of single dies (or small groups of dies) and of specific areas on multi-chip modules.

The present invention provides for the controlled grinding and polishing of the targeted areas so as to remove a very precise amount of material in a minimal amount of time while at the same time minimizing the generation of heat. Elements of polishing and milling techniques are combined to prevent the semiconductor device from being heat damaged without the need for complex cooling equipment to thereby greatly reduce cost and complexity. Moreover, the invention provides a degree of precision and reproducibility in the formation of an access window in a semiconductor device that had not previously been available.

The invention provides for the oscillation of the semiconductor device in the X-Y plane while a sequence of rotating tools are applied against the device along. The tools are rotated about the Z axis and float along such axis to engage the workpiece under a selectable constant force. The configurations of the tools are selected as a function of the composition of the particular material of the semiconductor device that is to be removed. The force with which a selected tool is brought to bear against the surface of the material device remains constant and a broad range of forces is available for selection. Those tools that are applied under a relatively light constant force have a radial surface with which material is removed while the tools that are rotated at relatively high constant force have a circumferential surface with which material is removed. The apparatus of the present invention allows the force that is applied to be quickly and easily adjusted and allows the speed of rotation to be adjusted. Additionally, the apparatus includes an oscillating table component to which the semiconductor device is positively affixed. The amplitude of the oscillations is adjustable. The tilt of the table is also adjustable about both the X direction and Y direction, to compensate for common angular error in the assembly operation so as to maintain the planar relationship between the working surface of the tool and the workpiece.

Prior to the actual removal of material from a semiconductor device, a device identical to the sample may be cross-sectioned in order to ascertain the identity, position and thicknesses of its various components. The appropriate tool and mode of operation can then be selected in order to remove the various layers without damaging the device or tools in as quick and as efficient manner as possible. The packaging material and substrate material is removed with the use of diamond polishing tools wherein the face of the rotating tools serve to remove material. Removal of certain intervening layers, such as the copper paddle material, requires a switch to a milling tool with which material is removed by its circumferential surface. The tilt of the table is adjusted when an interface between two layers is reached. Any divergence from a perpendicular orientation of the device with respect to the Z axis will be apparent as an area less than the total area defined by the X and Y oscillation will be revealed when the interface is first broached. The tilt of the table must then be adjusted such that a more even incursion into the successive layer is achieved. Final polishing is achieved with the use of a succession of various polishing tools in conjunction with abrasive pastes and extender fluids.

These and other features and advantages of the present invention will become apparent from the following detailed description of a preferred embodiment which, taken in conjunction with the accompanying drawings, illustrates by way of example the principles of the invention.

BRIEF DESCRIPTION OF THE DRAWINGS

FIG. 2 is a greatly enlarged, partially cut-away view of a semiconductor device;

FIG. 3 is a greatly enlarged, cross-sectional view taken along lines 3—3 of FIG. 2.

DETAILED DESCRIPTION OF THE PREFERRED EMBODIMENTS

The apparatus and method of the present invention provide for the preparation of semiconductor devices for construction or failure analysis which may employ any of a number of visualization techniques. The Figures generally illustrate the apparatus of the present invention with which the method may be practiced.

Figure 1:
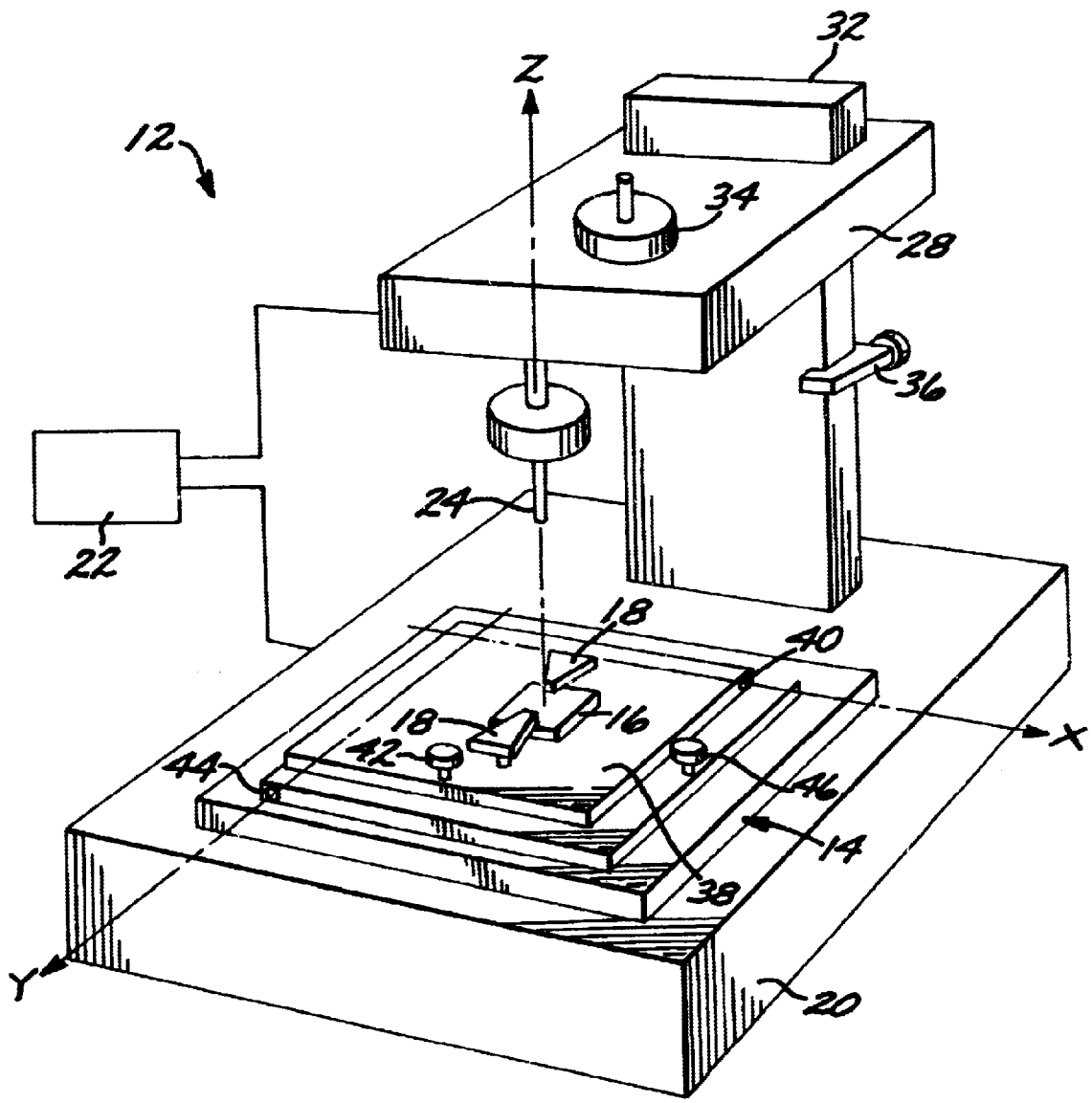
FIG. 1 is a schematic illustration of the apparatus of the present invention.

FIG. 1 is a schematic representation of the sample preparation apparatus 12 of the present invention. The apparatus includes a tilt table 14 for supporting a semiconductor device 16 and for oscillating the supported sample in the X and Y directions. Clamps 18 are attachable to the table for positively fixing the sample in position. Two drive motors are disposed in the base element 20 of the apparatus and serve to oscillate the table as is well known in the art. Both the speed and the amplitude of the oscillations in the X and Y directions are independently adjustable via controller 22. The oscillations in both directions are run in a criss-cross pattern. A pattern ratio of 7.5:1 assures an overlap of successive passes while a return delay at each end of the X excursion provides for straight 90 degree sides. In the event that the die dimension corresponds to a multiple of 7.5, the workpiece is merely turned by 90 degrees. A tool 24 held in a chuck 26 is rotated at an adjustable speed by the head element 28 which is movable in the Z direction. The speed of rotation is adjustable via input from controller 22. The head element is free to float in the Z direction wherein the force of gravity serves to exert a constant force on the tool 24 against the sample 16. Additional weight 34 can be added to the head in order to selectively adjust the force exerted by the tool on the sample. The downward movement of the floating head is ultimately limited by a stop element 36 which is adjustably positionable along the vertical support column 32. The tilt table 14 includes a mechanism as is well known in the art for allowing the actual support surface 38 to be tilted in two dimensions. For example, top surface 38 may include a pivot 40, aligned with the X axis, in combination with an adjustment screw 42 that allows the clearance between one end of the table a surface and a surface there below to be adjusted in addition to a second pivot 44, aligned with the Y direction, and a second adjustment screw 46 that allows the clearance with the surface there below to be adjusted.

FIG. 2 is a greatly enlarged, partial cutaway view of a semiconductor device 48. The particular device that is shown includes a die 50 that is encapsulated within a plastic package 52. The silicon die includes a frontside 54 and a back side 56 wherein leads 58 extend from the circuitry (not visible) formed in the front side of the die through the encapsulation to the exterior of the device. Semiconductor devices vary greatly in terms of their internal structure including, but not limited to, the composition and number of different encapsulation layers, the size, orientation and thickness of the die, the position, orientation and configuration of the leadframe, etc. FIG. 3 is a greatly enlarged cross-sectional view of a semiconductor device as is shown in FIG. 2. The encaspsulation 52 is shown as including two layers 58, 60 of different materials while a layer of copper 62 extends between the encapsulation 52 and the backside 56 of the die 50. Alternatively, the semi-conductor device to be analyzed by the method and with the apparatus of the present invention may be devoid of encapsulation.

The method of the present invention initially calls for the cross-sectioning of a sample similar to the sample to be subject to functional analysis in order to allow the position, dimensions and orientation of the die to be ascertained as well the composition and dimensions of the various layers of the device. This subsequently allows the proper selection of the type of tool, mode of operation, speeds and loads to be made for the various depths of operation.

For accessing the backside 56 of a semiconductor device 48, the sample 16 is first clamped or otherwise affixed, double-sided tape being adequate for most packages, to the support table such that the backside is extending upwardly. The sample is positioned such that sweep center of the table is aligned with the approximate center of the area of interest of the internal circuitry within the device. The amplitudes of oscillation both in the X direction as well as the Y direction are subsequently selected such that an area that corresponds to the entire area of interest is processed. Once the X and Y parameters are set, no further alteration thereof will be required throughout the entire procedure. In order to grind through most encapsulation materials a diamond tool 24 is selected wherein the tool has an abrasive surface formed on its distal radial surface. A typical speed of rotation, not to exceed about 6000 rpm, merely requires the addition of a drop or two of water to ensure adequate cooling. The head element 28 of the apparatus, and consequently the tool, is free to float along the Z axis and gradually grind down the surface of the workpiece material. The force with which the tool engages the sample is determined as is appropriate for the composition of the encapsulation material, the grit size of the selected too, the diameter of the tool and the speed of rotation, wherein weight 34 is added to the head element as necessary. Removal of the encapsulation may be accomplished in steps wherein the stop 36 is reset after a measurement is taken to ensure that the grinding tool will not impinge on the underlying copper layer. Running a diamond tool into copper would of course foul the tool and render it ineffective for future use. As the copper layer becomes exposed, any tilt will be readily become apparent as an area of copper less than the area defined by the X and Y amplitudes will become visible. Adjustment of the tilt screws 42, 46 will then be necessary in order to establish parallelism and complete the removal of the encapsulation.

Subsequent removal of a copper layer will require the use of a milling tool, configured for removing material by contact with its circumferential surface rather than with its distal radial surface. Additionally a maximum amount of weight 34 will be applied to the head whereby the head will in effect be locked against the stop 36 positioned at a preselected depth within the copper layer. Drops of oil rather than water are used during the milling operation to ensure adequate cooling. The copper material will be removed along the set depth rather than down to the set depth as per the previous step. Removal of the copper layer may again be accomplished in steps wherein a preselected portion of the total depth of the copper is removed and its removal confirmed 25–50 um at a time.

Once the copper paddle has been removed and the silicon die has been reached, it is again necessary to fit a diamond tool wherein the abrasive surface is formed on its distal radial surface and the force with which the tool is brought to bear against the workpiece is adjusted, by the removal of an appropriate amount of weight, such that the tool floats on the surface of the workpiece. Setting of the appropriate speed of rotation of the tool, force on the tool and the speed of oscillation of the table along with the addition of a few drops of water will ensure that the silicon will be removed without damaging the die. Removal should again be accomplished in sets, wherein the stop 36 is readjusted after each depth measurement until a depth to within about 150 to 175 um of the front side is achieved. Removal to within about 125 um is achieved with the use of a tool having a distal radial surface of xylem and an abrasive paste. Addition of a few drops of mineral oil may be necessary in order to ensure proper removal of the silicon material.

Once a depth of about 125 um of the frontside of the die is achieved, it is necessary to polish the ground away surface to a high luster. The xylem tipped tool in combination with finer and finer grit abrasive paste may be used as well as tools with a leather or polyurethane surface. Various polishing agents may be used including colloidal silica.

Figure 4:
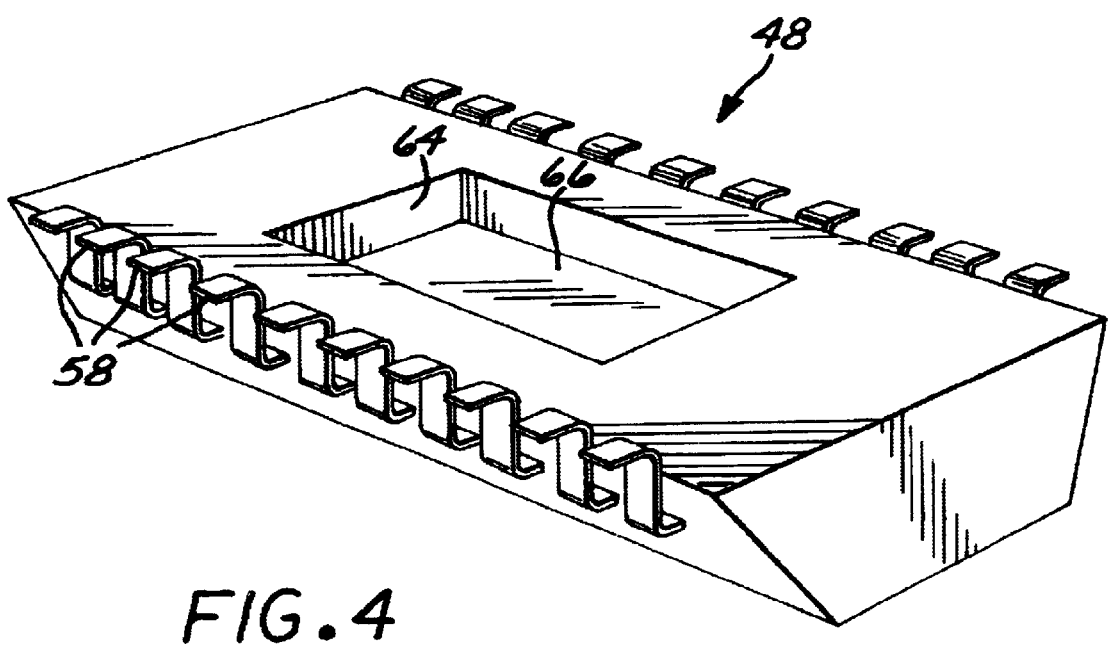
FIG. 4 is a greatly enlarged perspective view of sample prepared in accordance with the present invention.

Once the target depth has been reached and a satisfactory surface smoothness has been achieved, the sample is ready for testing. As is shown in FIG. 4, the backside of the semiconductor device 48 will have a window 64 formed therein having a base 66 which consists of the thinned backside of the silicon die through which the circuitry formed on the front side of the die is visualizable using any of various visualization techniques well known in the art. The leads 58 are inserted into an appropriate socket or otherwise energized and the functions of the semiconductor may be analyzed.

While a particular form of the invention has been illustrated and described, it will also be apparent to those skilled in the art that various modifications can be made without departing from the spirit and scope of the invention. The large variation in the construction of semiconductor devices require the details of the method to be tailored accordingly. The selection of the appropriate tools, oscillation rates, head preload, abrasive media, cooling media and removal rate to achieve the quickest removal without damaging the device is best determined by experimenting with a similar samples. Accordingly, it is not intended that the invention be limited except by the appended claims.

What is claimed is:

1. A method for removing a selected portion of a semiconductor device so as to enable visualization of its circuitry while said device is electrically intact, comprising the steps of:

oscillating said semiconductor device in an X and a Y direction, said X and Y directions defining a plane and wherein said semiconductor device is oscillated in preselected amplitudes along said X and Y directions so as to define an area that is less than the area defined by the periphery of said semiconductor device; and rotating a first tool at less than 6000 rpm about a Z axis that is perpendicular to said plane and engaging said semiconductor device with a distal radial surface of said tool with a constant force that is aligned along said Z axis, wherein said axial surface is configured for removing first preselected layers of said semiconductor device.

2. The method of claim 1, wherein said semiconductor device is encapsulated and wherein one of said first preselected layers comprises a portion of said encapsulation.

3. The method of claim 1, wherein said semiconductor device includes a silicon die and wherein one of said first preselected layers comprises a portion of said silicon die.

4. The method of claim 1, wherein said axial surface of said first tool has a diamond abrasive disposed thereon.

5. The method of claim 1, wherein said axial surface of said first tool comprises wood.

6. The method of claim 1, wherein said axial surface of said first tool comprises leather.

7. The method of claim 1, wherein said axial surface of said first tool comprises polyurethane.

8. The method of claim 1, further including the steps of cross-sectioning said semiconductor device and measuring the thicknesses of its layers so as to enable appropriate selection of said axial surface of said first tool to be made.

9. The method of claim 8, wherein said constant force is applied along said Z axis to preselected depths in said layers.

10. The method of claim 1, further comprising the steps of:

rotating a second tool at less than 10,000 rpm about said axis and locking said tool into a preselected position along said Z direction in engagement with said semiconductor device wherein said tool has a circumferential surface configured for removing second preselected layers of said semiconductor device; and oscillating said semiconductor device in said X and Y directions at said preselected amplitudes.

11. The method of claim 10, wherein said semiconductor device includes a copper paddle and one of said second preselected layers include a portion of said copper paddle.

12. The method of claim 10, further including the steps of cross-sectioning said semiconductor device and measuring the thicknesses of its layers so as to enable proper selection of said first and second tools.

13. The method of claim 1, further including the step of tilting said semiconductor device such that said plane is parallel with a plane defined by the interfaces of its layers.

* * * * *